(12) United States Patent
Minnis et al.

(10) Patent No.: US 6,420,940 B1
(45) Date of Patent: Jul. 16, 2002

(54) TRANSMITTER WITH A PHASE MODULATOR AND A PHASE LOCKED LOOP

(75) Inventors: Brian J Minnis, Pound Hill (GB); Pascal Philippe, Caen (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/622,213
(22) PCT Filed: Dec. 13, 1999
(86) PCT No.: PCT/EP99/10051
§ 371 (c)(1), (2), (4) Date: Aug. 14, 2000
(87) PCT Pub. No.: WO00/36742
PCT Pub. Date: Jun. 22, 2000

(30) Foreign Application Priority Data

Dec. 14, 1998 (GB) .............................................. 9827363

(51) Int. Cl.⁷ .............................................. H04L 27/12
(52) U.S. Cl. ....................... 332/103; 332/144; 375/302; 375/305; 375/274
(58) Field of Search ................................. 332/103, 100, 332/144; 375/302, 305, 274

(56) References Cited

U.S. PATENT DOCUMENTS 5,825,257 A * 10/1998 Klymyshyn et al. ........ 332/100

* cited by examiner

*Primary Examiner*—Arnold Kinkead
(74) *Attorney, Agent, or Firm*—Harold Tsiang

(57) ABSTRACT

A transmitter has a phase modulator and a phase locked loop that has a relatively high powered voltage controlled oscillator. The phase locked loop has a phase sensitive detector for comparing a phase comparison frequency derived from the voltage controlled oscillator output with a phase modulated intermediate frequency carrier derived from the phase modulator. The phase modulator has a reference frequency source, means for deriving four quadrature phase components of the reference frequency produced by the source and phase selection means controlled by complex modulation means for deriving the phase modulated intermediate frequency carrier by random interpolation between the four quadrature components.

9 Claims, 4 Drawing Sheets

TRANSMITTER WITH A PHASE MODULATOR AND A PHASE LOCKED LOOP

BACKGROUND OF THE INVENTION

1. Field of the Invention

The present invention relates to a transmitter having particular, but not exclusive, application in cellular telephones operating in accordance with or based on standards such as GSM (Global System for Mobile Communications). For convenience of description the present invention will be described with reference to the GSM 900 Standard.

The transmitter may be the transmitting part of a transceiver and in the present specification and claims "transmitter" is intended to cover a stand alone transmitter and a transmitting part of a transceiver.

2. Description of the Related Art

FIGS. 1 and 2 of the accompanying drawings respectively show the transmitter noise and modulation specification for GSM 900 and a spectral template for modulation. FIG. 1 indicates the permitted levels of unwanted noise in a 1 Hz bandwidth referenced to a carrier power level of +33 dBm. In the region of the GSM receive band, Rx Band, between 935 MHz and 960 MHz, the noise must be held below −162 dBc and between 925 MHz and 935 MHz it must be below −150 dBc. Such low noise levels are not easy to achieve, especially with a fully integrated transmitter.

FIG. 2 illustrates the spectral template showing the modulation spectrum and limits on phase noise close to the carrier indicated by the zero frequency. Between 400 kHz and 1800 kHz, and between −400 kHz and −1800 kHz, it desirable to have a margin of say 10 dB between the template and the floor of the phase noise. In order to be able to meet this requirement, the error in the phase trajectory for the modulation at an output of the transmitter VCO (voltage controlled oscillator) must be substantially less than 5° rms and 20° peak for 148 bits of random data.

SUMMARY OF THE INVENTION

An object of the present invention is to provide a transmitter architecture which is able to achieve predetermined transmitter noise and modulations specifications and to be capable of being integrated.

According to the present invention there is provided a transmitter comprising a phase modulator and a phase locked loop having a relatively high powered voltage controlled- oscillator (VCO), wherein the phase modulator comprises a reference frequency source and means for deriving phase modulation signals by random interpolation between at least 2 phase components derived from the reference frequency source.

The present invention provides a transmitter comprising a phase modulator and a phase locked loop having a relatively highpowered voltage controlled oscillator (VCO) and a phase sensitive detector having an input coupled to an output of the phase modulator, the phase modulator comprising a reference frequency source,.means for deriving at least 2 phase components of the reference frequency produced by said source and phase selection means controlled by a modulator for deriving a phase modulating signal by random interpolation between the at least 2 phase components.

An embodiment of the present invention uses a fixed frequency stable reference oscillator whose output is split into four quadrature phase components of equal amplitude. A single pole, 4-way tap selector selects any one of the four quadrature phase components for delivery to the phase locked loop (PLL). To obtain precisely the required instantaneous phase, the tap selector is made to hop randomly and quickly between the four quadrature phase components in what is essentially a process of interpolation. By hopping quickly, any noise is shifted outside the band of wanted frequencies and is removed by loop filtering. The switching is conducted under the control of a complex, 2 bit, bit—stream modulator such that the average position of the tap selector corresponds to the value of the phase required and the energy in the quantisation noise is translated to a high frequency, outside the bandwidth of the PLL.

This architecture produces very low levels of noise close to the carrier and is tolerant to integrated circuit process variations. It is simple, flexible and easily realisable method of applying modulation to an IF carrier.

BRIEF DESCRIPTION OF THE DRAWINGS

The present invention will now be described, by way of example, with reference to the accompanying drawings, wherein.

In the drawings, the same reference numerals have been used to indicate corresponding features.

DETAILED DESCRIPTION OF THE INVENTION

Figure 1:
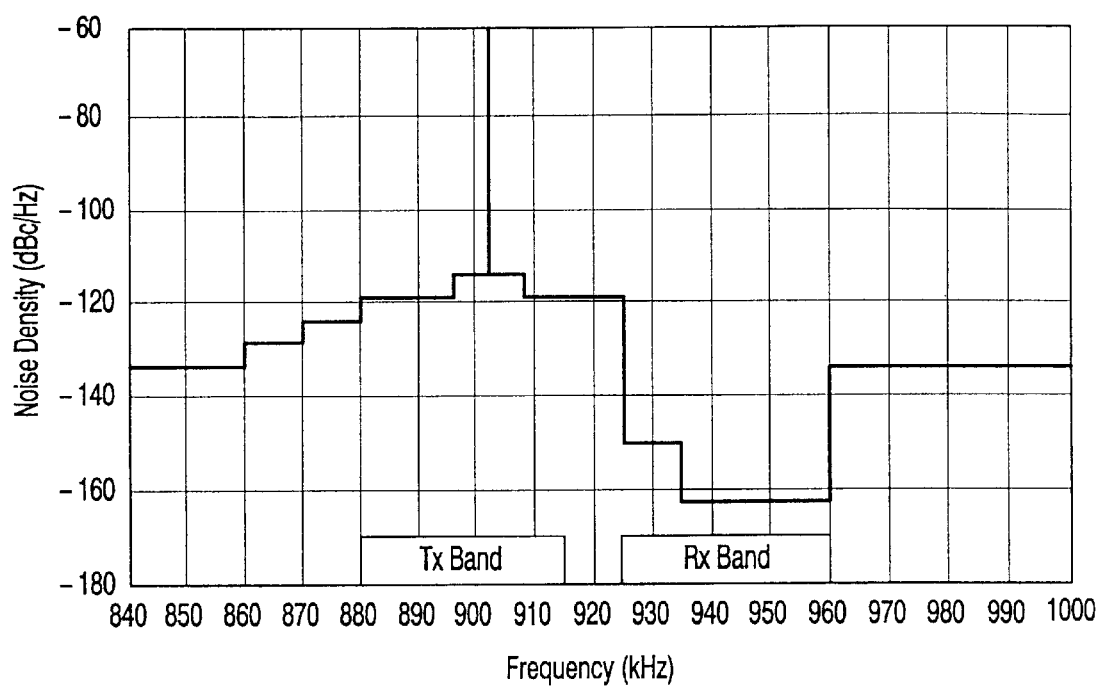
FIG. 1 is a graph showing the transmitter noise and modulations specification for GSM 900.
Figure 2:
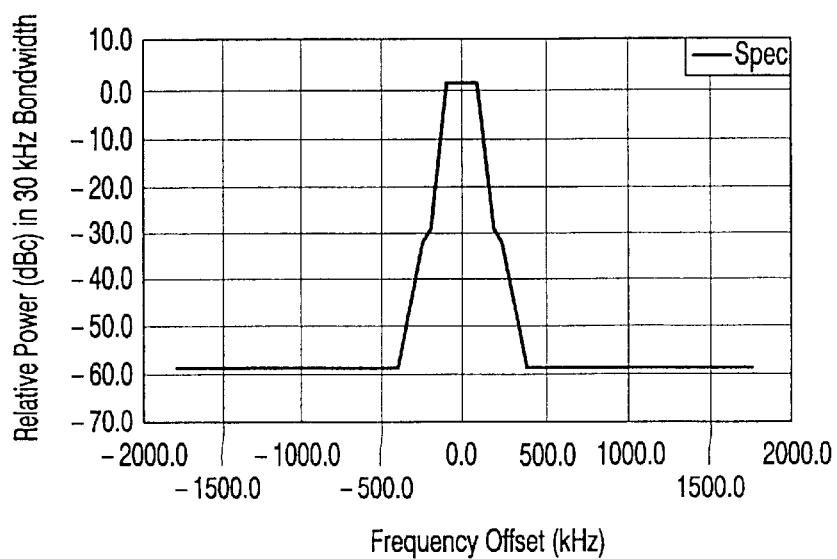
FIG. 2 shows a template for modulation.
Figure 3:
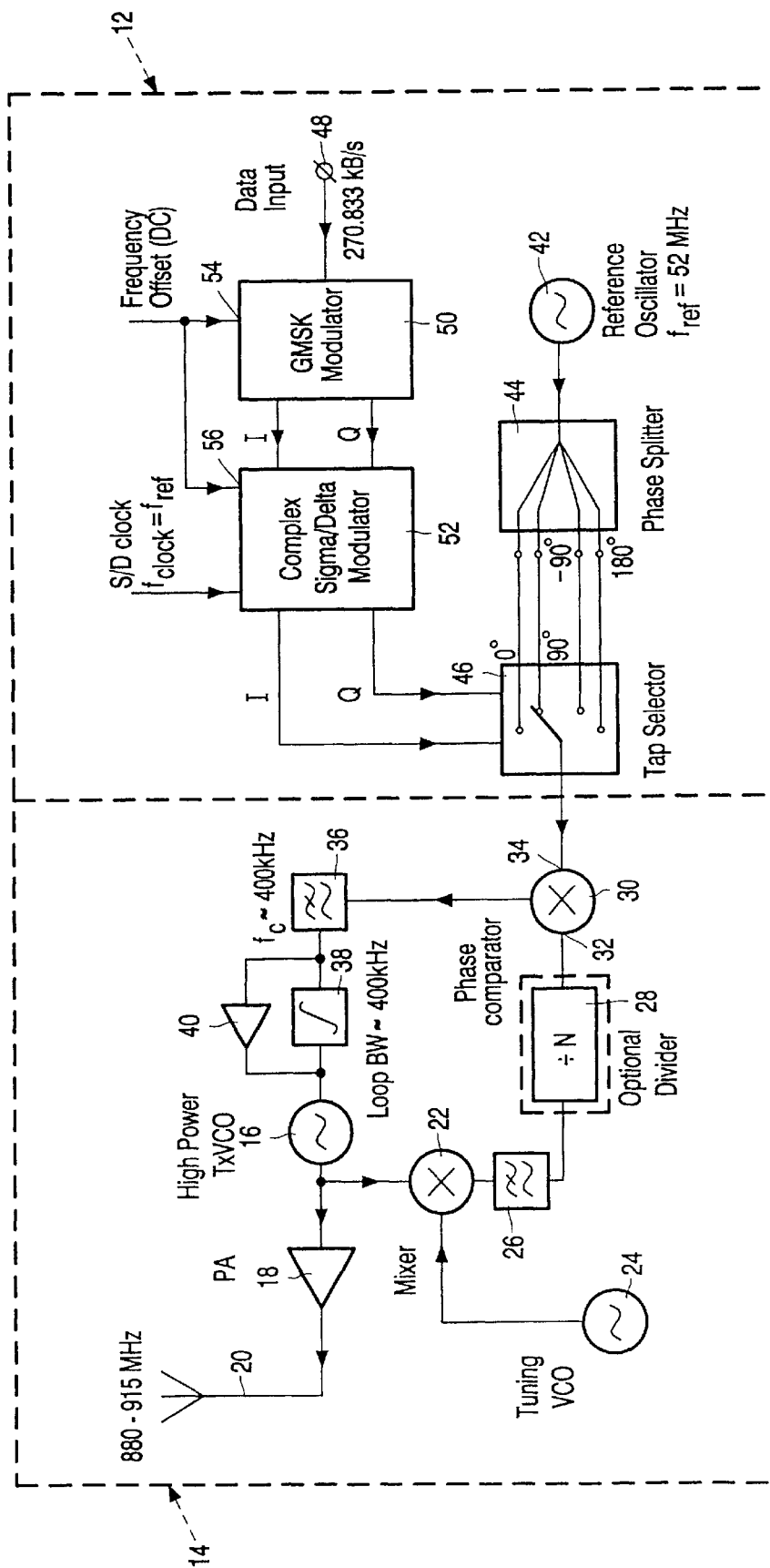
FIG. 3 is a block schematic diagram of an embodiment of a transmitter made in accordance with the present invention.

The transmitter 10 shown in FIG. 3 comprises a phase modulator 12 which provides an intermediate frequency (IF) carrier on which the appropriate phase modulation and any desired frequency offset has been applied, which modulated IF carrier is applied to a transmit loop 14 which is essentially a phase locked loop (PLL).

Referring initially to the transmit loop 14, it comprises a high power transmitter VCO16 which generates an output signal in the GSM transmit band of 880 to 915 MHz. An output of the VCO16 is coupled to a power amplifier 18 which in turn is coupled to a signal propagator consisting of an antenna 20.

Wide band tuning of the VCO16 involves mixing the output signal frequency down to a phase comparison frequency. The output of the VCO16 is coupled to one input of a mixer 22, a second input of which is coupled to an external tuning VCO24. In the case of the transmitter being part of a transceiver, the VCO24 could be used to generate the local oscillator frequency of the receiver (not shown). The products of mixing are applied to a low pass filter 26 which passes the difference frequency. The difference frequency is coupled to an input 32 of a phase comparator 30, optionally by way of a divider 28. The modulated IF carrier from the phase modulator 12 is coupled to another input 34 of, the phase comparator 30. The phase comparator 30 functions as a phase sensitive detector and a signal representative of the phase difference between the signals on the input 32, 34, is supplied to an integrator 38, 40 by way of a low pass filter 36. The integrator 38, 40 provides an output voltage which is used to pull the VCO16 frequency as required.

In operation the task of phase locked loop (PLL) is to reproduce the phase modulation present on the input modulated IF carrier from the phase modulator 12 and transfer it to the VCO16 as faithfully as possible. In so doing it must also act as a tunable, narrow-band filter which removes any unwanted noise on the IF carrier outside the bandwidth of the modulation. In the case of GSM the modulation bandwidth for GSM extends beyond the channel spacing of 200 kHz to a value approaching 400 kHz. The loop bandwidth therefore, must not be much lower than this figure to avoid distorting the modulation but must not be much higher if it is to attenuate phase noise effectively. To meet the GSM specification on spurious emissions, the loop must continue to provide extremely heavy attenuation of any phase noise at large frequency offsets of the order of 20 MHz. Furthermore, the loop VCO itself must generate extremely low levels of phase noise (i.e. −162 dBc/Hz) at the 20 MHz offset and for this reason must have a relatively high output power.

The design of the PLL is largely a matter of determining the optimum loop dynamics (i.e. the loop bandwidth) such that the transmitter output passes both the rms. phase trajectory error requirement of 5° and the spectral template requirement with good working margin on both. The transmit loop 14 employs two integrators, one internal and one external to the VCO16 making the loop of second order for frequencies substantially inside the loop bandwidth. The feed-forward path around the external loop integrator ensures loop stability by forcing the loop transfer function to revert to first order at a frequency just below the open-loop cut-off frequency of 180 kHz. The extra lowpass filter 36 in the loop is a time-continuous, analogue filter which provides the heavy filtering required for the wideband phase noise. It is of degree 2, thereby giving the loop a third order characteristic beyond the closed-loop bandwidth of approximately 400 kHz.

Optionally, if the divider 28 is present the transmitter output is mixed down to a multiple of the phase comparison frequency. This can offer the advantage of an increased offset. tuning capability by virtue of the increased frequency gain of the loop. However, the increased frequency gain also demands lower levels of phase quantisation noise at the output of the phase modulator 12, which may or may not be easy to achieve. As the divider ratio N is increased, there is a trade-off between the offset tuning capability that can be achieved and the level of phase noise appearing on the VCO16 output. To maintain the correct phase trajectory for the modulation, the instantaneous phase deviation as generated in a GMSK modulator block 50 in the phase modulator 12 must also be divided by N. The extreme case of using only a divider 28 for the frequency translation of the VCO16 output has its attractions in terms of eliminating the mixer 22 and the external VCO24 but care has to be exercised not to seriously compromise one or more other performance parameters of the system.

Turning to the phase modulator 12, the basic principle of its operation is to take the sinusoidal output of a stable reference oscillator 42, in this example having a frequency $f_{ref}$=52 MHz, and using an analogue phase splitter 44 to derive four relative output phases, for example 0°, 90°, −90° and 180° (as shown) or 45°, 135°, −135° and −45°. The four relative output phases are supplied to respective taps of a tap selector 46 which is controlled to provide the modulated IF carrier which is supplied to the input 34 of the phase comparator 30.

In order to ensure that the IF carrier is modulated with the correct phase, the phase is derived by interpolating between the four phases available at the tap selector 44 by switching between the taps randomly and very quickly. The randomisation process must ensure that the average output phase is equal to the value required and that the spectrum of the noise contains as little energy as possible at low frequencies.

The signals for operating the tap selector 46 to interpolate between the four phases are derived from the input data signal which is applied to an input 48 of the GMSK (Gaussian Minimum Shift Keying) modulator block 50. In the last stage of the GMSK block 50, a complex pair of I and Q signal components is constructed by taking the cosine and sine of the instantaneous phase deviation. The I and Q signal components are fed to a complex sigma/delta modulator 52 which is clocked at a frequency $f_{clock}=f_{ref}$. The complex sigma/delta modulator 52 randomises the I and Q components, producing two streams of pulses of values +1 or −1, whose sequences have the correct average values as well as the required noise spectrum profile. These two streams of pulses are used as a 2-bit address which determines the instantaneous position of the tap selector 46. The result is that the modulation now appears on the IF carrier at the output of the tap selector together with quantisation noise which is readily removable by the filtering action of the PLL.

Phase comparison usually takes place at the IF, which in the absence of any frequency offset is equal to the reference frequency. However, a frequency offset can be applied in the phase modulator 12 without any need to change the setting of the tuning VCO24 associated with the PLL. Applying a frequency offset can, for example, reduce the number of frequency steps needed in the tuning VCO. A tuning offset can be applied numerically on an input 54 of the GMSK modulator block by adding a phase ramp whose slope is equal to the frequency offset required. The tuning offset can also be applied to an input 56 of the sigma/delta modulator 52. The offset can be positive or negative and its effect simply propagates through the sigma/delta modulator 52 causing the tap selector 46 to rotate, on average, in either a positive or negative direction. Hence, the IF moves away from the reference frequency by the corresponding offset whilst leaving the phase trajectory of the modulation completely unaffected. The transmit loop 14 simply makes an identical shift in the frequency of the output VCO16 (assuming the absence of the divider 28 in the loop) and performs the phase comparison at the new IF.

An advantage of applying an identical frequency offset to the GMSK modulator 50 and to the complex sigma/delta modulator 52 is that the s spectrum of the quantisation noise makes exactly the same frequency shift as the modulation. Consequently, there is no increase in signal-to-noise ratio as the tuning offset is applied and the limit on tuning offset becomes determined largely by the precision of the numerical processes within the sigma/delta modulator (e.g. word length and fixed point arithmetic) and by the tuning capability of the main VCO16. Whilst less critical to tuning offset, some regard has also to be paid to the chosen reference frequency, particularly for negative frequency shifts. It may be possible to tolerate a shift by as much as −50 MHz for a 52 MHz reference before difficulties arise with image filtering in the PLL. For positive frequency shifts however, there is in theory no limit imposed by the reference frequency.

Figure 4:
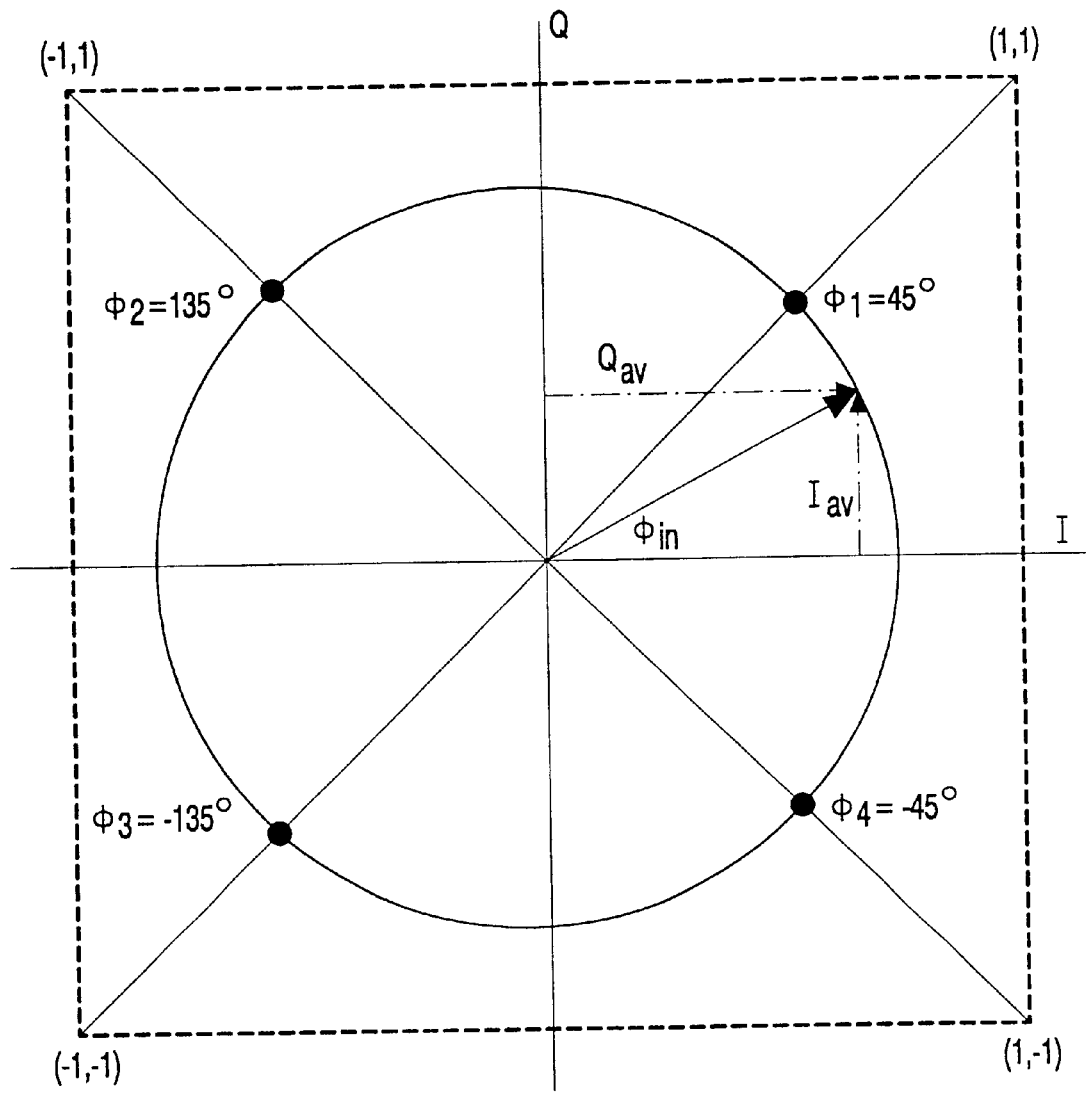
FIG. 4 is a diagram illustrating phase interpolation with four phase values using I and Q sigma/delta modulators.

FIG. 4 illustrates the phase interpolation process and shows the constellation of I and Q values. at the output of the complex sigma/delta modulator 52 and the corresponding phase constellation at the output of the tap selector 46. These phase values sit on a circle of a diameter, for example a diameter of 0.7, which corresponds to the factor by which the I and Q values were scaled at the input to the complex sigma/delta modulator 52. It is then the average values of the I and Q components, $I_{av}$ and $Q_{av}$, that determine the average or "interpolated" value of the phase. Whilst the magnitude of the complex vector is of no consequence. in this system and is in any case discarded. by the tap selector 46, it is worth noting that the information concerning the amplitude of the vector is still present at the output of the complex sigma/delta modulator 52. Hence, if a non-constant envelope modulation scheme incorporating an amplitude component had to be used, it could be injected into the scaling blocks just before,the modulator and would still be recoverable after the appropriate filtering at the output of the modulator.

Figure 5:
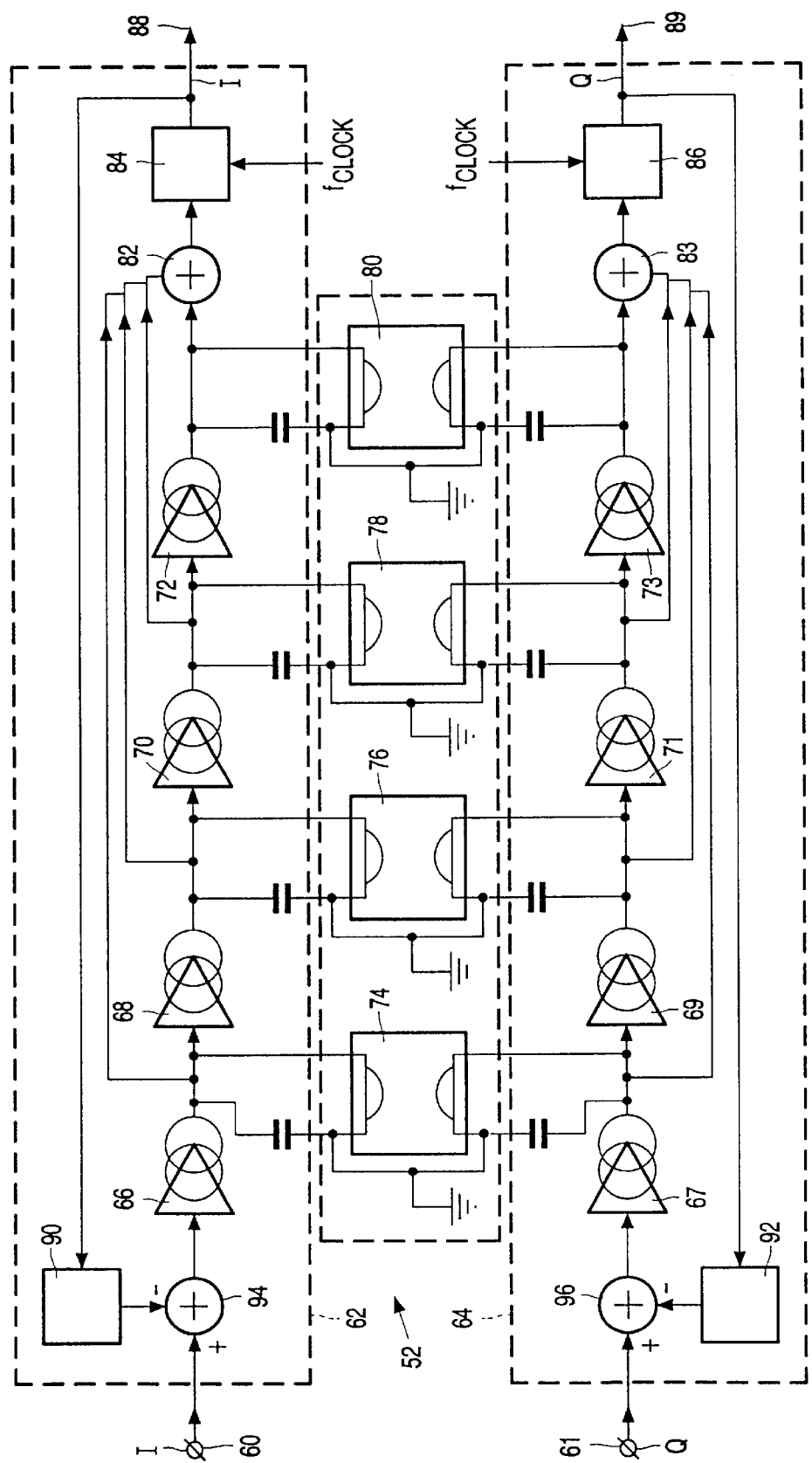
FIG. 5 is a block schematic diagram of a complex sigma/delta modulator suitable for illustrating the concept of a digitally implemented complex sigma/delta modulator 52 used in the transmitter shown in FIG. 3.

The complex sigma/delta modulator of the type used in the phase modulator 12 is a purely digital element. However for the purposes of explanation it is helpful to think of the sigma/delta modulator in terms of an analogue equivalent such as that shown in FIG. 5 which illustrates an embodiment of a complex cross coupled, continuous time, low pass sigma/delta modulator 52 in some detail. Quadrature related signals I and Q are applied respectively to input terminals 60, 61. Each input terminal 60, 61 is coupled to a fourth—order, sigma/delta modulator 62, 64. Each modulator 62, 64 comprises a loop filter consisting of four series connected transconductor capacitor integrators 66, 68, 70, 72 and 67, 69, 71, 73. All four integrators of each modulator are cross-coupled by gyrators 74, 76, 78, 80. Each stage can be set to resonate at a respective frequency in the IF band; the frequency being determined in accordance with the ratio $g_m/C$. However it is usual to have them all set at the same frequency. When that frequency is zero, the cross-coupled gyrators become redundant. The value of C is set by the noise requirements and conductance $g_m$ is set to give the desired centre frequency for that value of C. Cross coupling these stages has the effect of introducing a negative susceptance at each capacitor site whose value is determined by the shift in frequency required and the characteristic admittance of the gyrator. Outputs of each of the four stages 66, 68, 70, 72 and 67, 69, 71, 73 are combined in respective summation stages 82, 83. Outputs of the stages are applied to respective 1-bit quantisation elements 84, 86 in which the analogue signals are oversampled to provide 1 bit signals at $f_{clock}$ on the outputs 88, 89, respectively. By choosing a high oversampling ratio, that is, the higher the number of samples over which the average can be made, the greater is the frequency range over which quantisation noise is spread, and the easier the task of the PLL in removing this noise.

The outputs of the quantisation elements 84, 86 are also fed back, scaled in magnitude, if necessary, by scalers 90, 92 and combined in summation stages 94, 96 with signals on the respective input terminals 60, 61. The feedback loops ensure that, in the frequency band of interest, the average value of the quantisation noise produced by the quantisation elements 84, 86 is as small as possible.

In implementing the transmitter 10 the GMSK modulator block 50 and the complex sigma/delta modulator 52 are both digital components and therefore do not suffer any physical imperfections. They can be implemented in a combination of software running on a general purpose digital signal processor (DSP) and dedicated hardware co-processors. They are therefore highly versatile and able to cope with other modulation schemes besides the GMSK associated with GSM. The reference oscillator 42, the phase splitter 44 and the tap selector 46 are very simple analogue components, as are all the constituent parts of the PLL.

Although the present invention has been described with reference to the phase splitter 44 deriving four phase components, it is possible for as little as two phase components to be used if the range of phase interpolation can be restricted or especially if the direction of phase rotation can be determined by some other means and for more than four phase components to be derived.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of integratable transmitters and component parts thereof and which may be used instead of or in addition to features already described herein.

What is claimed is:

1. A transmitter comprising a phase modulator and a phase locked loop having a relatively high powered voltage controlled oscillator (VCO), wherein the phase modulator comprises a reference frequency source and means for deriving phase modulation signals by random interpolation between at least 2 phase components derived from the reference frequency source.

2. A transmitter comprising a phase modulator and a phase locked loop having a relatively high powered voltage controlled oscillator (VCO) and a phase sensitive detector having an input coupled to an output of the phase modulator, the phase modulator comprising a reference frequency source, means for deriving at least 2 phase components of the reference frequency produced by said source and phase selection means controlled by a modulator for deriving a phase modulating signal by random interpolation between the at least 2 phase components.

3. A transmitter as claimed in claim 2, wherein said means for deriving phase components derives four phase components.

4. A transmitter as claimed in claim 3, wherein the phase modulator comprises a modulator for constructing a complex pair of quadrature related signal components and a complex sigma/delta modulator for randomising the complex pair of quadrature related signal components and producing two streams of pulses which comprise a 2-bit address which is applied to the phase selection means at such speed as to enable an average output phase to be equal to a value required.

5. A transmitter as claimed in claim 4, wherein the modulator for constructing a complex pair of quadrature related signal components is a GMSK modulator.

6. A transmitter as claimed in claim 4, wherein means are coupled to the modulator for constructing a complex pair of quadrature related signal components and to the complex sigma/delta modulator for shifting a spectrum of the noise and for applying a tuning offset.

7. A transmitter as claimed in claim 1, wherein the phase locked loop comprises a phase sensitive detector for comparing a phase comparison frequency derived from the VCO with a phase modulating signal from the phase modulator.

8. A transmitter as claimed in claim 7, wherein a time continuous analogue low pass filtering for filtering-out wide band phase noise is coupled to the phase sensitive detector and an output of the low pass filter is applied to an integrator having an output coupled to the VCO.

9. A transmitter as claimed in claim 7, wherein the phase comparison frequency is derived by dividing the VCO frequency.

* * * * *